US005178689A

United States Patent [19]

Okamura et al.

[11] Patent Number: 5,178,689

[45] Date of Patent: Jan. 12, 1993

[54] FE-BASED SOFT MAGNETIC ALLOY, METHOD OF TREATING SAME AND DUST CORE MADE THEREFROM

[75] Inventors: Masami Okamura; Takao Sawa, both of Tokyo, Japan

[73] Assignee: Kabushiki Kaisha Toshiba, Kawasaki, Japan

[21] Appl. No.: 711,415

[22] Filed: Jun. 5, 1991

Related U.S. Application Data

[63] Continuation of Ser. No. 353,065, May 17, 1989, abandoned.

[30] Foreign Application Priority Data

May 17, 1988 [JP] Japan ........ 63-118335
Nov. 30, 1988 [JP] Japan ........ 63-300686

[51] Int. Cl.[5] ........ H10F 1/04

[52] U.S. Cl. ........ 148/306; 148/307; 148/310; 148/311; 148/305; 420/89; 420/92; 420/93

[58] Field of Search ........ 148/304, 305, 306, 307, 148/310, 311; 420/89, 92, 93

[56] References Cited

U.S. PATENT DOCUMENTS

| | | | |
|---|---|---|---|
| 4,473,400 | 9/1984 | Hoselitz | 148/304 |
| 4,495,487 | 1/1985 | Kavesh et al. | 340/572 |
| 4,581,080 | 4/1986 | Meguro et al. | 148/307 |
| 4,881,989 | 11/1989 | Yoshizawa et al. | 148/302 |
| 4,985,089 | 1/1991 | Yoshizawa et al. | 148/303 |

FOREIGN PATENT DOCUMENTS

| | | | |
|---|---|---|---|
| 0271657 | 6/1988 | European Pat. Off. | 148/305 |
| 2539002 | 4/1976 | Fed. Rep. of Germany | 148/307 |
| 56-133447 | 10/1981 | Japan | 148/307 |
| 60-52557 | 3/1985 | Japan | 148/304 |
| 61-87848 | 5/1986 | Japan | 148/304 |
| 61-149459 | 7/1986 | Japan | 148/304 |
| 62-179704 | 8/1987 | Japan | 148/304 |
| 63-239906 | 10/1988 | Japan | 148/305 |

*Primary Examiner*—John P. Sheehan
*Attorney, Agent, or Firm*—Foley & Lardner

[57] ABSTRACT

Fe-based soft magnetic alloy having excellent soft magnetic characteristics with high saturated magnetic flux density, characterized in that it has fine crystal grains dispersed in an amorphous phase and is expressed by the general formula:

$$Fe_{100-a-b-c}Cu_aM_bY_c$$

where:
"M" is at least one or more selected from elements of groups IVa, Va, VIa of the periodic table, Mn, Co, Ni, Al, and the Platinum group,
"Y" is at least one or more selected from Si, B, P, or C
and $3<a\leqq 8$ (atomic %)
$0.1<b\leqq 8$
$3.1\leqq a+b\leqq 12$
$15\leqq c\leqq 28$.

Also described is a dust core made from an alloy powder having fine crystal grains dispersed in an amorphous phase and expressed by the formula $$Fe_{100-a-b-c-d-e}Cu_aM'_bM''_cSi_dB_e$$

where:
"M'" is at least one element selected from the groups consisting of Group IVa, Va, VIa of the periodic table;
"M''" is at least one element from the group consisting of Mn, Co, Ni, Al, and the Platinum group;
and wherein "a", "b", "c", "d" and "e", expressed in atomic %, are as follows:
$3<b\leqq 8$
$0.1<b\leqq 8$
$0\leqq c\leqq 15$
$8\leqq d\leqq 22$
$3\leqq e\leqq 15$
$15\leqq d+e\leqq 28$.

A method of treating the alloy to separate the fine crystal grains is also described which comprises heat treating said alloy for from one minute to ten hours at a temperature of from 50° C. below the crystallization temperature to 120° C. above the crystallization temperature.

30 Claims, 4 Drawing Sheets

FE-BASED SOFT MAGNETIC ALLOY, METHOD OF TREATING SAME AND DUST CORE MADE THEREFROM

This application is a continuation of application Ser. No. 07/353,065, filed May 17, 1989 abandoned.

BACKGROUND OF THE INVENTION

This invention relates to Fe-based, soft magnetic alloys and a dust core of said alloy.

Conventionally, iron cores of crystalline materials such as permalloy or ferrite have been employed in high frequency devices such as switching regulators. However, the resistivity of permalloy is low, so it is subject to large core loss at high frequency. Also, although the core loss of ferrite at high frequencies is small, the magnetic flux density is also small, at best 5,000 G. Consequently, in use at high operating magnetic flux densities, ferrite becomes close to saturation and as a result the core loss is increased.

Recently, it has become desirable to reduce the size of transformers that are used at high frequency, such as the power transformers employed in switching regulators, smoothing choke coils, and common mode choke coils. However, when the size is reduced, the operating magnetic flux density must be increased, so the increase in core loss of the ferrite becomes a serious practical problem.

For this reason, amorphous magnetic alloys, i.e., alloys without a crystal structure, have recently attracted attention and have to some extent been used because they have excellent soft magnetic properties such as high permeability and low coercive force. Such amorphous magnetic alloys are typically base alloys of Fe, Co, Ni, etc., and contain metalloids as elements promoting the amorphous state, (P, C, B, Si, Al, and Ge, etc.).

However, not all of these amorphous magnetic alloys have low core loss in the high frequency region. Iron-based amorphous alloys are cheap and have extremely small core loss, about one quarter that of silicon steel, in the frequency region of 50 to 60 Hz. However, they are extremely unsuitable for use in the high frequency region for such applications as in switching regulators, because they have an extremely large core loss in the high frequency region of 10 to 50 kHz. In order to overcome this disadvantage, attempts have been made to lower the magnetostriction, lower the core loss, and increase the permeability by replacing some of the Fe with non-magnetic metals such as Nb, Mo, or Cr. However, the deterioration of magnetic properties due to hardening, shrinkage, etc., of resin, for example, on resin molding, is large compared to Co-based alloys, so satisfactory performance of such materials is not obtained when used in the high frequency region.

Co-based, amorphous alloys also have been used in magnetic components for electronic devices such as saturable reactors, since they have low core loss and high squareness ratio in the high frequency region. However, the cost of Co-based alloys is comparatively high making such materials uneconomical.

As explained above, although Fe-based amorphous alloys constitute cheap soft magnetic materials and have comparatively large magnetostriction, they suffer from various problems when used in the high frequency region and are inferior to Co-based amorphous alloys in respect of both core loss and permeability. On the other hand, although Co-based amorphous alloys have excellent magnetic properties, they are not industrially practical due to the high cost of such materials.

In the technical field of dust cores, use is made of iron powder, Mo permalloy, etc. for dust cores in noise filters and choke coils, since they can be produced in a variety of shapes more easily than can thin strips. However, there are problems in their use in power sources at high frequency owing to the comparatively large core loss.

As described above, Fe-based amophous alloys constitute an inexpensive soft magnetic material, but their magnetostriction is comparatively large, and they are inferior to Co-based amorphous alloys in respect of core loss and permeability, so that there are problems in using these materials in the high frequency region. On the other hand, although Co-based amorphous alloys have excellent magnetic properties, as hereinbefore pointed out, the high price of the raw material makes them commercially disadvantageous. Also, such materials also suffer disadvantages where used for dust cores since they too have comparatively large core losses, causing problems in their use in power sources of high frequency.

SUMMARY OF THE INVENTION

Consequently, having regard to the above problems, the object of this invention is to provide an Fe-based soft magnetic alloy having high saturation magnetic flux density in the high frequency region, with excellent soft magnetic characteristics.

Another object of this invention is to provide an Fe-based dust core capable of being produced in various shapes and also having excellent soft magnetic characteristics with high saturation magnetic flux density in the high frequency region.

According to the first embodiment of the invention, there is provided an Fe-based soft magnetic alloy having fine crystal grains dispersed in an amorphous phase and as described in the following formula:

$$Fe_{100-a-b-c}\,Cu_a\,M_b\,Y_c;$$

where

- "M" is at least one element selected from the group consisting of Groups IVb, Vb, VIb of the periodic table, Mn, Co, Ni, Al and the Platinum group;
- "Y" is at least one element selected from the group consisting of Si, B, P, and C; and wherein "a", "b", and "c", expressed in at. % are as follows $3<a\leqq 8$ $0.1<b\leqq 8$ $3.1\leqq a+b\leqq 12$ $15\leqq c\leqq 28$.

Also according to the second embodiment of the invention there is provided a dust core made from the copper-containing alloy having fine crystal grains dispersed in an amorphous phase and expressed by the formula:

$$Fe_{100-a-b-c-d-e}Cu_a\,M'_b\,M''_c\,Si_d\,B_e$$

where:

- "M'" is at least one element selected from the group consisting of Groups IVb, Vb, VIb of the periodic table;
- "M''" is at least one element from the group consisting of Mn, Co, Ni, Al, and the Platinum group;

and wherein "a", "b", "c", "d" and "e", expressed in at. % are as follows:

$3 < a \leq 8$
$0.1 < b \leq 8$
$0 \leq c \leq 15$
$8 \leq d \leq 22$
$3 \leq e \leq 15$
$15 \leq d + e \leq 28$.

In the preferred embodiments, it is desirable that fine crystal grains are present to the extent of at least 30% in terms of the area ratio in the alloy. It is further desirable that at least 80% of the fine crystal grains be of a size in the range of 50 Å to 300 Å. The term "area ratio" of fine crystal grains as used therein means the ratio of the surface of the fine grains to the total surface in a plane of the alloy as measured, for example, by photomicrography or by microscopic examination of ground and polished specimens.

A method of treating the alloy to segregate fine crystal grains is also provided which comprises heat treating said alloy for from one minute to ten hours at a temperature of from 50° C. below the crystallization temperature to 120° C. above the crystallization temperature.

In order to attain the above objects, and desired properties it is important to control the composition of the alloy and to balance the constituents as hereinafter described. In particular, it is desirable that fine crystal grains should be present to the extent of 30% or more in terms of area ratio in the alloy. It is further desirable that 80% or more of the fine crystal grains be of a size in one range of 50 Å to 300 Å.

In another aspect of the invention it was also discovered that an alloy powder having fine crystal grains and is expressed by the following formula also possesses excellent properties and is especially suitable for manufacture of dust cores:

$$Fe_{100-a-b-c-d-e}\,Cu_a\,M'_b\,M''_c\,Si_d\,B_e$$

where "M'" is at least one element from the group consisting of Groups IVb, Vb, VIb of the periodic table;

"M''" is at least one element from the group consisting of Mn, Co, Ni, Al, and the Platinum group; and "a", "b", "c", "d", and "e", expressed in at. % are as follows $3 < a \leq 8$,
$0.1 < b \leq 8$,
$0 \leq c \leq 15$,
$8 \leq d \leq 22$,
$3 \leq e \leq 15$,
$15 \leq d + e \leq 28$.

Optimum properties at this alloy powder are also achieved when the fine crystal grains are present to the extent to at least 30% in terms of area ratio in the alloy and it is further preferable that, of these fine crystal grains, at least 80% should be crystal grains of 50 Å to 300 Å.

DETAILED DESCRIPTION OF THE PREFERRED EMBODIMENTS

Figure 1:
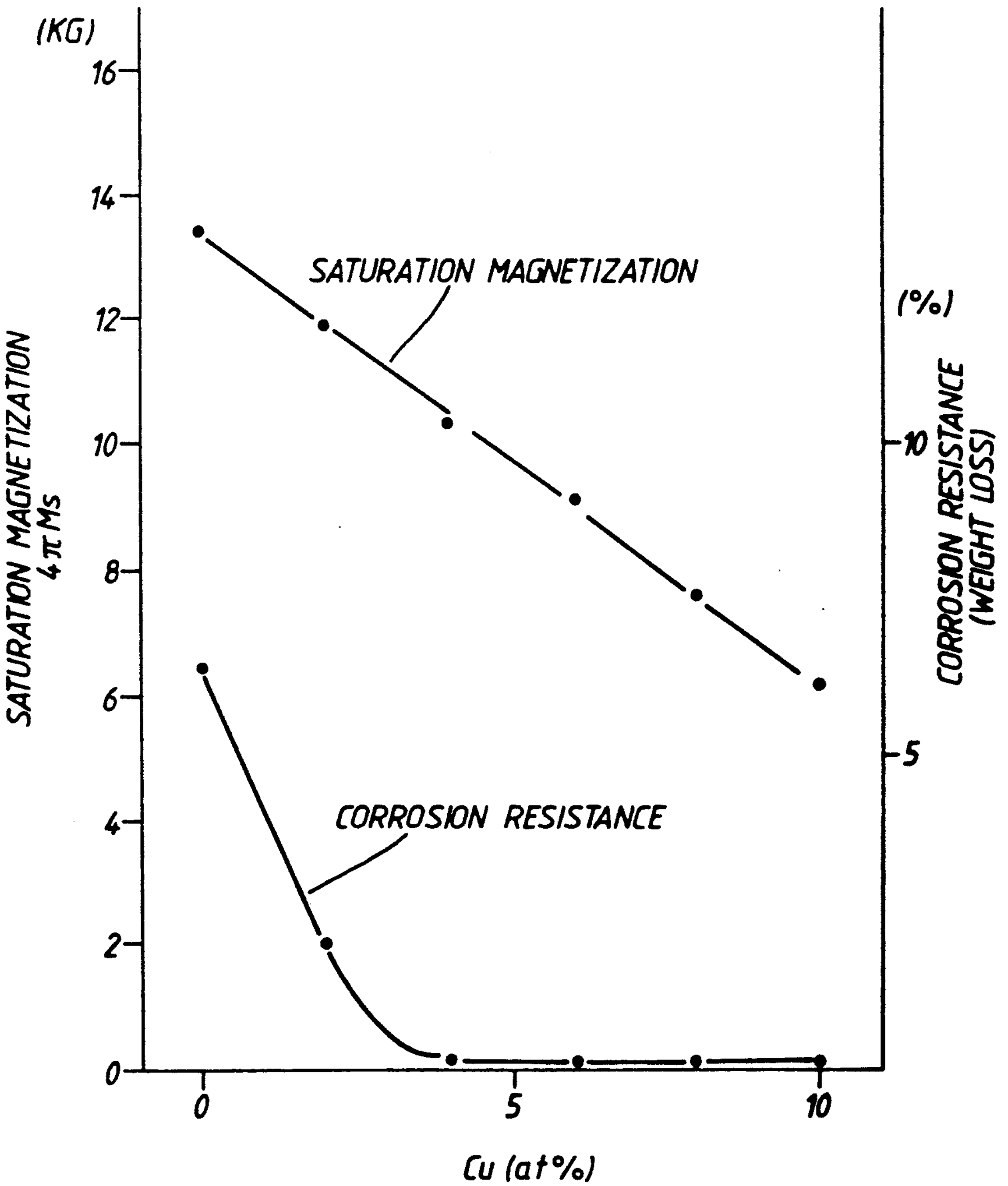
FIG. 1 is a graph of the variation of corrosion resistance and saturation magnetization resulting form the addition of Cu to the alloy of this invention.

In accordance with the invention, it is important that the alloy components are within the proportions indicated. Copper is especially important because it is effective in increasing corrosion resistance, preventing coarsening of the crystal grains, and improving soft magnetic characteristics such as core loss and permeability. However, if too little Cu is present, the benefit of the addition is not obtained. On the other hand, if too much Cu is present, the magnetic characteristics are adversely affected. A range of more than 3 and less than 8 at % is therefore selected. This is particularly desirable in the use of the alloy for dust cores, since the packing ratio is increased by increased amounts of Cu. Preferably, the amount of Cu is more than 3 and less than 5 at %.

In the first embodiment "M" is at least one element from the group consisting of Groups IVb, Vb, VIb of the periodic table, Mn, Co, Ni, Al and the Platinum group, i.e., Ru, Rh, Pd, Os, Ir and Pt as elements of the Platinum group. These elements are effective in making the crystal grain size uniform, and in improving the soft magnetic properties by reducing magnetostriction and magnetic anisotropy. It is also effective in improving the magnetic properties in respect of temperature change. However, if the amount of "M" is too small, the benefit of addition is not obtained and if the amount is too large, the saturation magnetic flux density is lowered. An amount in the range 0.1 to 8 at % is selected. Preferably the amount is 1 to 7 at %, and even more preferably 1.5 to 5 at. %. In addition to the above-mentioned effects, the various elements comprising "M" have the following respective effects: in the case of Group IV elements, increase of the range of heat treatment conditions for obtaining optimum magnetic properties; in the case of Group Vb elements, increase in the resistance to imbrittlement and in workability such as by cutting; in the case of Group VIb elements, improvement of corrosion resistance and surface morphology; in the case of Al, increased fineness of the crystal grains and reduction of magnetic anisotropy, thereby improving magnetostriction and soft magnetic properties.

The elements Nb, Mo, Cr, Mn, Ni and W are desirable to lower core loss, and Co is desirable in particular to increase saturation magnetic flux density.

In the second embodiment "M'" is at least one element from the group consisting of Groups IVb, Vb, VIb of the periodic table. These elements are effective in making the crystal grain size uniform, and is effective in improving the soft magnetic properties by lowering magnetostriction and magnetic anisotropy. They also improve the magnetic properties with respect to change of temperature. However, if too little is used, the benefit of the addition is not obtained. On the other hand, if too much is used, the saturation magnetic flux density is lowered. An amount of 0.1 to 8 at. % is therefore selected. Preferably the range is 1 to 7 at. %, and even more preferably 1.5 to 5 at. %. In this connection, the additive elements in M' have, in addition to the aforementioned benefits, the following benefits: in the case of Group IVb elements, an expansion of the range of heat treatment conditions that are available in order to obtain optimum magnetic properties; in the case of the Group Vb elements, increase in resistance to embrittlement and increase in workability such as cutting; in the case of the Group VIb elements, increase in corrosion resistance and improvement in surface configuration, resulting in improvement in magnetostriction and soft magnetic properties.

The elements Nb, Mo, Ta, W, Zr and Hf are particularly preferable in lowering core loss.

In the second embodiment "M'''" has at least one element from the group consisting of Mn, Co, Na, Al, and the Platinum group. These elements are effective in improving soft magnetic characteristics. However, it is undesirable to use to much, since this results in lowered saturation magnetic flux density. An amount of less than 15 at. % is therefore specified. Preferably the amount is less than 10 at. %.

Preferably the total amount of Cu, M' and M'' is 3.1 to 25 at. %. If the total amount is too small, the benefit of the addition is slight. On the other hand, if it is too large, the saturation magnetic flux density tends to be reduced.

In the first embodiment "Y" is at least one element from the group consisting of Si, B, P and C. These elements are effective in making the alloy amorphous during manufacture, or in directly segregating fine crystals. If the amount is too small, the benefit of superquenching in manufacture is difficult to obtain and the above condition is not obtained but if the amount is too large saturation magnetic flux density becomes low, making the above condition difficult to obtain, with the result that superior magnetic properties are not obtained. An amount in the range 15 to 28 at. % is therefore selected. Preferably the range is 18 to 26 at. %. In particular, the ratio of (Si, C)/(P, B) is preferably more than 1.

In the second embodiment, Si is effective in obtaining the amorphous state of the alloy during manufacture or in directly segregating fine crystals. If the amount of Si used is too small, there is little benefit from superquenching during manufacture and the aforementioned condition is not obtained but if the amount is too large, the saturation magnetic flux density is lowered and the aforesaid condition becomes difficult to obtain, so that superior magnetic properties are not obtained. An amount in the range 8 to 22 at. % is therefore selected. Preferably the range is 10 to 20 at. %, and even more preferably 12 to 18 at. %. Boron, like silicon, is an element that is effective in obtaining the amorphous condition of the alloy, or in directly segregating fine crystals. If the amount is too small, the benefit of superquenching in manufacture is difficult to obtain and the aforementioned condition is not obtained. On the other hand, if the amount used is too large, problems with magnetic characteristics result. An amount in the range 3 to 15 at. % is therefore selected. Preferably, the range is 5 to 10 at. %. If the total of Si and B is too small, the benefit of their addition is not obtained. On the other hand, if the total amount is too large, the benefit is likewise difficult to obtain, and there is a lowering of saturation magnetic flux density. A total amount in the range 15 to 28 at. % is therefore preferable.

The Fe-based soft magnetic alloy and alloy powder of this invention may be obtained by the following method.

An amorphous alloy thin strip is obtained by liquid quenching. A quenched powder is obtained by grinding, or by an atomizing method or by mechanical alloying method, etc. The alloy is heat treated for from one minute to 10 hours preferably 10 minutes to 5 hours at a temperature of from 50° C. below the crystallization temperature to 120° C. above the crystallization temperature preferably 30° C. to 100° C. above the crystallization temperature of the amorphous alloy, to segregate the fine crystal grains. Alternatively, segregation of the fine crystals may be obtained by controlling the quenching speed in the quenching method.

With respect to the importance of the fine crystal grains, it has been determined that if there are too few fine crystal grains in the alloy of this invention i.e. if there is too much amorphous phase, an adverse effect on the magnetic properties during molding is increased, with increased core loss, lower permeability and higher magnetostriction. It is therefore preferable that the fine crystal grains in the alloy should be present to the extent of at least 30% in terms of area ratio.

Furthermore, if the crystal grain size in the aforementioned fine crystal grains are too small, maximum improvement in magnetic properties is not obtained. On the other hand, if too large, the magnetic properties are adversely affected. It is therefore preferable that, in the fine crystal grains, crystals of grain size 50 Å to 300 Å should be present to the extent of at least 80%.

The Fe-based soft magnetic alloy of this invention has excellent soft magnetic properties at high frequency. It is useful as an alloy for magnetic materials for magnetic components such as for example magnetic heads, thin film heads, radio frequency transformers including transformers for high power use, saturable reactors, common mode choke coils, normal mode choke coils, high voltage pulse noise filters, and magnetic switches used in laser and other power sources, magnetic cores, etc. used at high frequency, and for sensors of various types, such as power source sensors, direction sensors, and security sensors, etc.

As indicated previously, the alloy of the invention is also particularly useful for dust cores. However in this application, if the size of the particles is too small, the packing ratio is lowered. On the other hand, if the particle size is too large, losses become considerable, making the core unfit for high frequency use. A particle size of 1 to 100 μm is therefore preferable.

The shape of the particles is not prescribed, and could be, for example, spherical or flat. These shapes depend on the method of manufacture. For example, in the case of the atomizing method, spherical powder is obtained, but if this is subjected to rolling treatment, flat powder is obtained.

The alloy powders are subjected to the ordinary press forming and sintering is advantageously carried out while performing heat treatment for 10 minutes to 10 hours at 450° C. to 650° C.

In this process, an inorganic insulating material such as a metallic alkoxide, water glass, or low melting point glass is used as a binder.

The following examples further illustrate the invention.

EXAMPLES OF FIRST EMBODIMENT

Amorphous alloy thin strips of about 15 μm were obtained by the single rolling method from master alloy consisting of $Fe_{75-a}Cu_aNb_3Si_{12}B_{10}$, for a=0, 2, 4, 6, 8, and 10.

These thin strips were then subjected to heat treatment for about 80 minutes at a temperature about 20° C.

higher than the crystallization temperature of this alloy (measured with a rate of temperature rise of 10° C./min.).

The corrosion resistance of the thin strip that was obtained was measured as the loss in initial weight on immersion for 100 hours in 1N HCl. The results are described in FIG. 1. The amorphous alloy strip was then wound to form a toroidal magnetic core of external diameter 18 mm, internal diameter 12 mm, and height 4.5 mm, which was then subjected to heat treatment in the same way as above.

The saturation magnetization of the magnetic core obtained was measured by a vibrating sample magnetometer (VSM) These results are also shown in FIG. 1.

It can be seen from FIG. 1 that the corrosion resistance is greatly improved by the Cu addition; the value falling to below 0.5% when the Cu addition exceeds 3 at. %. Also, if the Cu addition exceeds 8 at. %, the saturation magnetization becomes 7.5 KG, which is a value equal to that of Co-based amorphous alloy. To satisfy corrosion resistance and saturation magnetization, the value of the Cu content should therefore be more than 3 at % and less than 8 at. %.

When the core loss was measured at B=2 KG, f=100 KHz, low core loss of 290 to 330 mW/cc was found except at X=0 at. %.

Thin alloy strips of the above alloy compositions $Fe_{71\,5}Cu_{3.5}Nd_{13}Si_{13}B_9$ were wound to form a toroidal core of external diameter 18 mm, internal diameter 12 mm, and height 4.5 mm, which was then subjected to heat treatment under the conditions shown in Table 1. For comparison, a core was manufactured by performing heat treatment at about 430° C. for about 80 min. It was found by TEM observation that fine crystals grains had not segregated in the magnetic core that was obtained.

Five samples of magnetic core material according to this invention in which fine crystal grains were present and five samples of the magnetic core material of the comparison examples in which fine crystal grains were not present. The core loss after heat treatment at B=2 KG and f=100 KHz and the core loss and magnetostriction after epoxy resin molding were measured, and the permeability and saturation flux density at 1 KHz, 2 mOe were measured. The mean values are shown in Table I.

TABLE I

| Alloy Composition | Whether fine crystal grains are present | Core loss (mw/cc) Before molding | After molding | Magnetostriction ($\times 10^{-6}$) | Permeability $\mu'$ IKHz ($\times 10^4$) | Saturation magnetic flux density (kG) |
|---|---|---|---|---|---|---|
| $Fe_{715}Cu_{3.5}Nd_3Si_{13}B9$ | Yes | 210 | 250 | 1.1 | 12.8 | 11.7 |
| $Fe_{715}Cu_{3.5}Nd_3Si_{13}B9$ | No | 670 | 2860 | 13.5 | 1.2 | 11.7 |

As is clear from the above Table I, in comparison with the magnetic cores consisting of amorphous alloy thin strip of the same composition, the alloy of this invention, owing to the presence of fine crystal grains, shows excellent soft magnetic properties at high frequencies, have high permeability with low core loss, in particular, after resin molding, and low magnetostriction.

With the present invention, an Fe-based soft magnetic alloy can be provided having excellent soft magnetic properties, owing to the presence of fine crystal grains in the desired alloy composition and high saturated magnetic flux density in the high frequency region.

EXAMPLES OF THE SECOND EMBODIMENT

With an alloy system consisting of $Fe_{75-x}Cu_xNb_3Si_{15}B_7$, spherical powders of 10 to 50 μm were manufactured by the atomizing method for X=1, 2, 3, 4, 5, 6, and 7.

Toroidal cores of 38×19×12.5 mm were pressure formed of these powders using water glass as a binder. Sintering was then performed at 550° C. for 60 minutes in the case of X=1 to 3,530° C. and 60 minutes in the case of X=4 and 5, and 500° C. and 60 minutes in the case of X=6 and 7.

Figure 2:
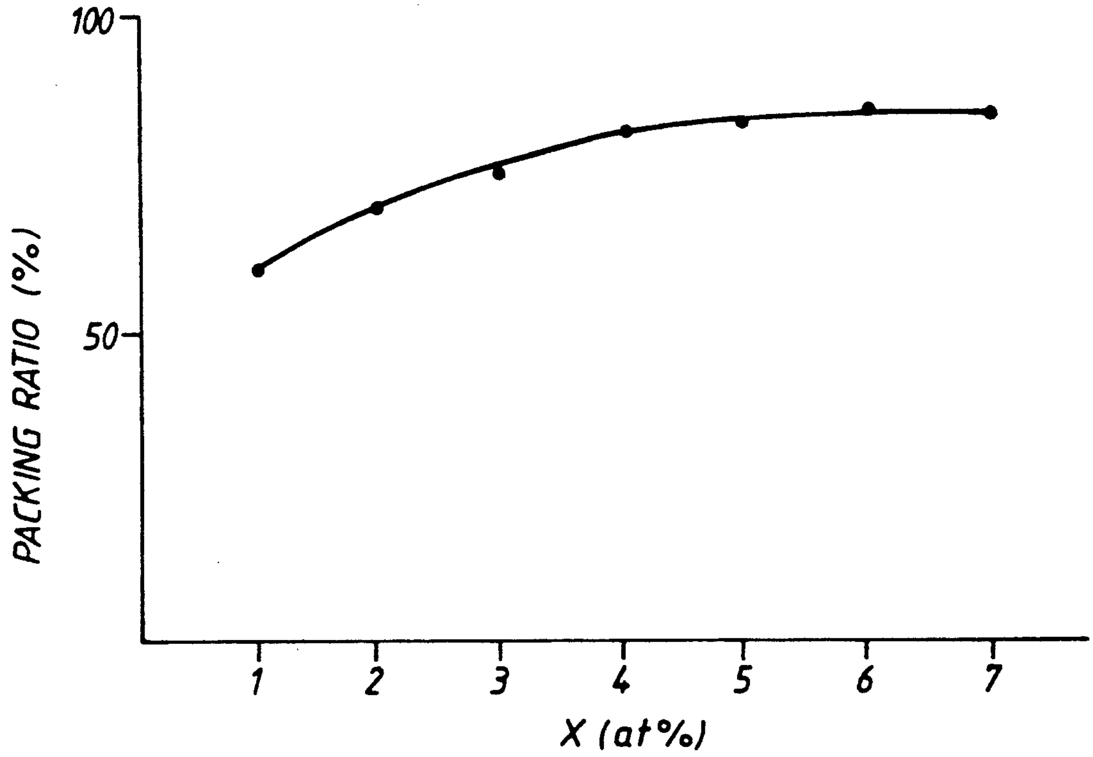
FIG. 2 is a graph showing the effect on packing ratio of changes in amount of Cu amount.

The packing ratio for these cores was then examined. As shown in FIG. 2, it was found that the packing ratio increased with increase in the amount of Cu.

Figure 3:
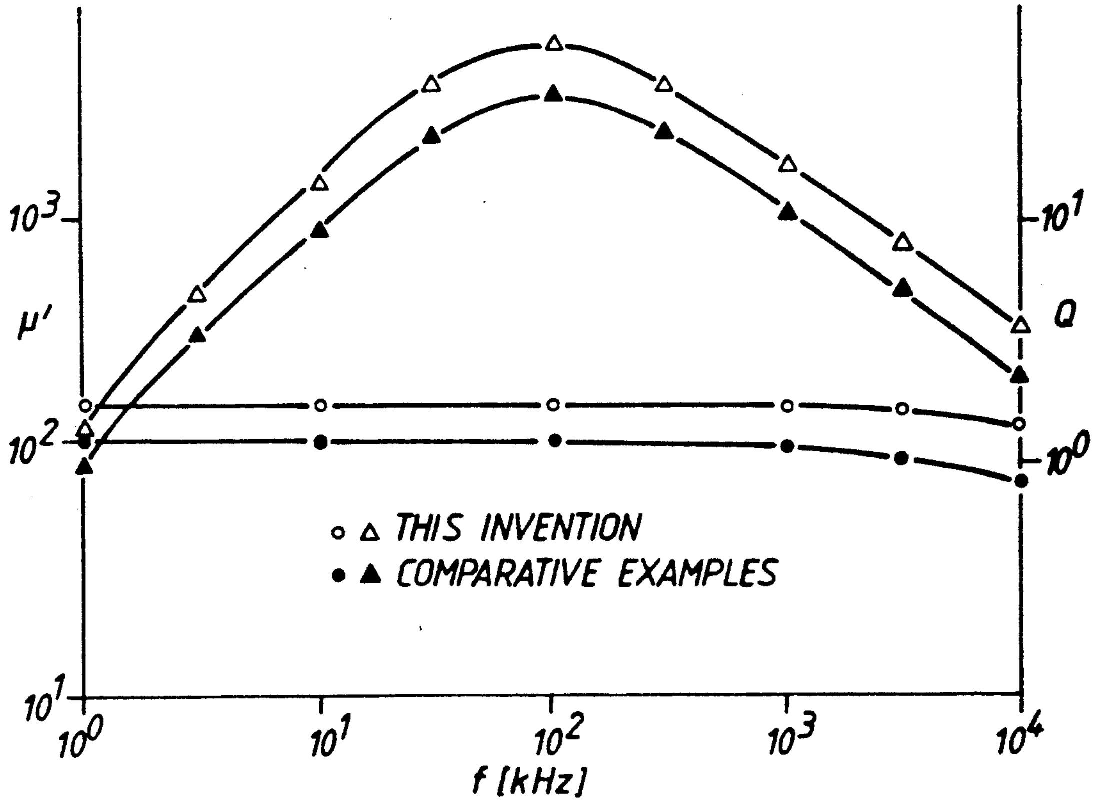
FIG. 3 is a graph showing the $\mu'$, Q-F characteristics of the invention and of comparative examples.

Also, for X=2 and X=4 of these samples, the μ', Q-f characteristics were measured. In this measurement, an LCR meter was used, winding 20 turns onto the magnetic core and using a voltage of 1 V. The results are shown in FIG. 3. As is clear from FIG. 3, the alloy of this invention (X=4) shown for comparison, and would be effective as a magnetic core for a choke core transformer or the like.

Figure 4:
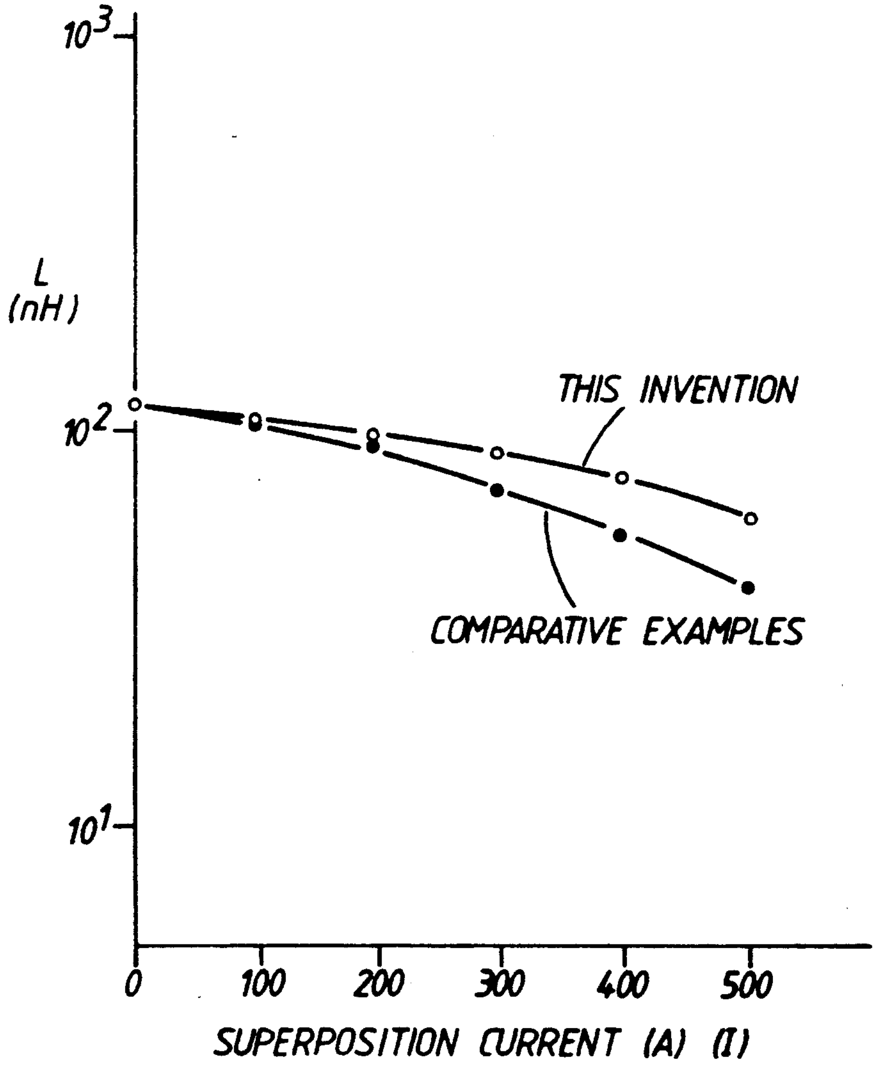
FIG. 4 is a graph showing the DC superposition characteristic of this invention and of comparative examples.

The DC superposition characteristic was also measured using the same samples. The results are shown in FIG. 4. It is clear from these results that the magnetic core of this invention is superior.

The various alloy powders shown in Table II were manufactured by the atomizing method. The powders obtained were spherical powders, of powder size 10 to 50 μm.

The powders were pressure formed into toroidal cores of 38×19×12.5 mm, using water glass as binder. The cores were subjected to heat treatment at 540° C. for 60 minutes in the case of samples 1 to 6, and used for carrying out the measurements.

For comparison, a sample 7 was manufactured in the same way. Furthermore, for comparison, an $Fe_{79}Si_{10}B_{11}$ amorphous thin strip, an evaluation was performed for an iron powder dust core of the same shape, and for a toroidal core sample 8 which was wound to the same shape, and subjected to heat treatment, resin impregnation and gap forming.

FIG. 2 shows the results obtained by measuring μ'10 kHz and q10 kHz for these cores. It can be seen that high μ' and high Q values are obtained with the cores of this invention.

TABLE II

| Sample | Composition | μ' 1 KHz | $Q_{100\ KHz}$ |
|---|---|---|---|
| 1 | $Fe_{72}Cu_4Ta_3Si_{14}B_7$ | 160 | 50 |
| 2 | $Fe_{72}Cu_4W_3Si_{14}B_7$ | 160 | 50 |
| 3 | $Fe_{72}Cu_4Mo_3Si_{14}B_7$ | 157 | 48 |
| 4 | $Fe_{72}Cu_4Nb_3Si_{14}B_7$ | 165 | 53 |
| 5 | $Fe_{72}Cu_4Nb_2Cr_2Si_{14}B_6$ | 165 | 52 |
| 6 | $Fe_{72}Cu_4Nb_2Ru_2Si_{14}B_6$ | 167 | 55 |
| 7 | $Fe_{71}Cu_1Mo_3Si_{13}B_{12}$ | 105 | 28 |

TABLE II-continued

| Sample | Composition | μ' 1 KHz | $Q_{100\ KHz}$ |
|---|---|---|---|
| 8 | $Fe_{79}Si_{10}B_{11}$ (cut core) | 100 | 25 |
| 9 | Iron powder dust | 30 | 11 |

Alloy powder of the composition $Fe_{79}$-xCuxNb-$_2Si_{13}B_6$ was manufactured by the atomization method. The powder obtained was a spherical powder of particle size 10 to 50 μm.

This powder was pressure formed into toroidal cores of 38>19×12.5 mm, using water glass as binder, and measurement samples were prepared by carrying out heat treatment at 500° C. for 90 minutes.

Saturation magnetization for the samples obtained was measured, using a VSM, in a magnetic field of 10 KOe. The results are shown in FIG. 5.

Figure 5:
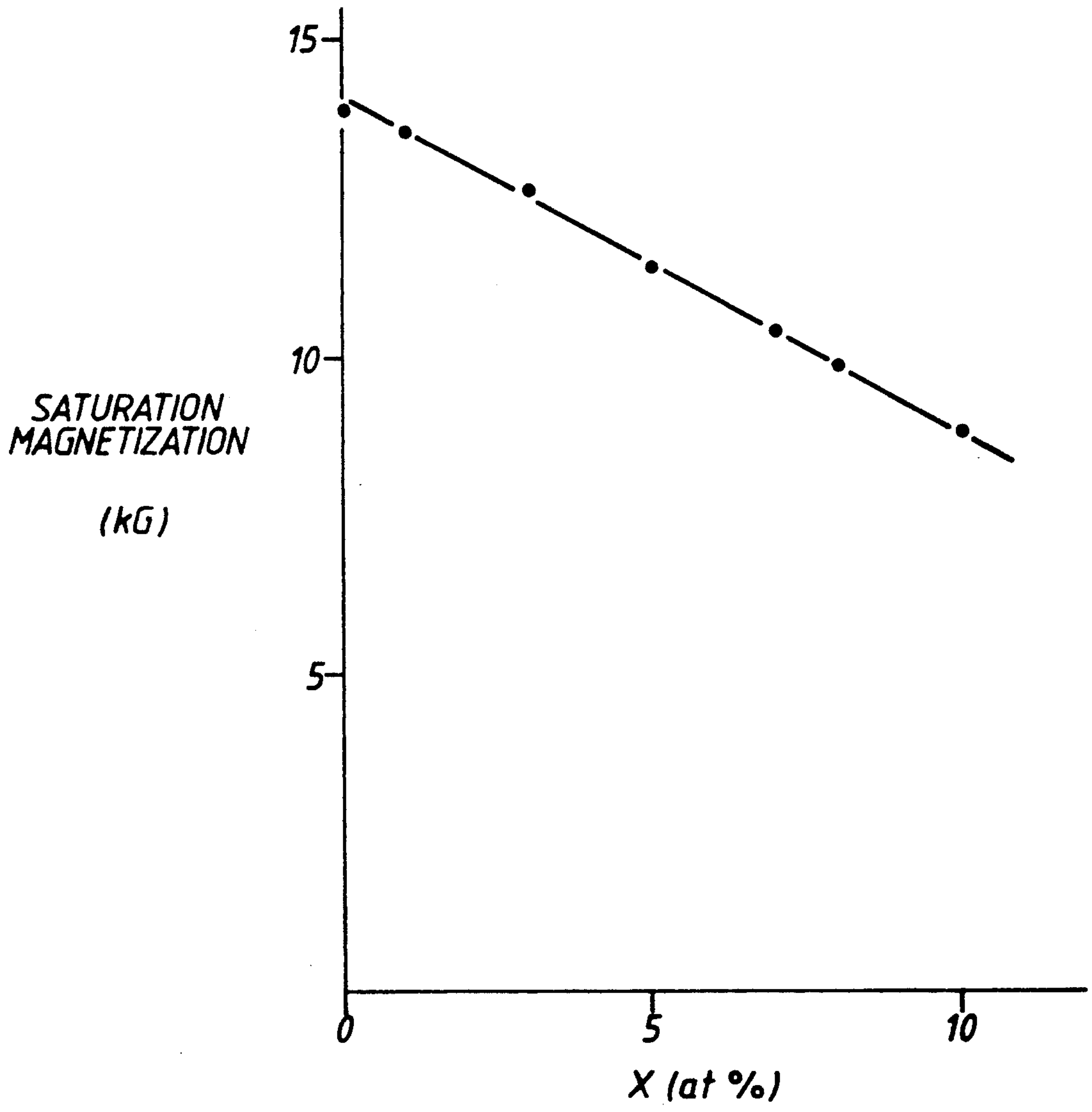
FIG. 5 is a graph showing the effect on saturation magnetization of change in the amount of Cu.

It is clear from FIG. 5 that saturation magnetization is reduced by replacing Fe by Cu, and there are practical problems when the Cu exceeds 8 at. %.

As described above, this invention makes it possible to provide an Fe-based dust core that has a high saturation magnetic flux density, excellent soft magnetic characteristics at high frequency and that is capable of being made in various shapes.

The foregoing description and examples have been set forth merely to illustrate the invention and are not intended to be limiting. Since modifications of the described embodiments incorporating the spirit and substance of the invention may occur to persons skilled in the art, the scope of the invention should be limited only by the appended claims and equivalents, wherein:

What is claimed is:

1. An Fe-based soft magnetic alloy having fine crystal grains dispersed in an amorphous phase and as described in the following formula:

$$Fe_{100-a-b-c}Cu_aM_bY_c$$

where

"M" is at least one element selected from the group consisting of Ti, Zr, Hf, V, Nb, Ta, Cr, Mo, W of the periodic table, Mn, Co, Ni, Al and the Platinum group;

"Y" is at least one element selected form the group consisting of Si, B, P, and C; and wherein "a", "b", and "c", expressed in atomic % are as follows:

$3<a\leqq 8$ $0.1<b\leqq 8$ $3.1\leqq a+b\leqq 12$ $15\leqq c\leqq 28$.

2. An Fe-based soft magnetic alloy according to claim 1 wherein the area ratio of the fine crystal grains present in the alloy is at least 30%.

3. An Fe-based soft magnetic alloy according to claim 1 wherein of least 80% of fine crystal grains present in the alloy are in the range of 50 Å to 300 Å.

4. An Fe-based soft magnetic alloy according to claim 2 wherein at least 80% of the fine crystal grains present in the alloy are in the range of 50 Å to 300 Å.

5. An Fe-based soft magnetic alloy according to claim 1 wherein the amount of Cu is more than 3 and less than 5 atomic %.

6. An Fe-based soft magnetic alloy according to claim 1 wherein the amount of "M" is 1 to 7 atomic %.

7. An Fe-based soft magnetic alloy according to claim 1 wherein the amount of "M" is 1.5 to 5 atomic %.

8. An Fe-based soft magnetic alloy according to claim 1 wherein the amount of "Y" is 18 to 26 atomic %.

9. An Fe-based soft magnetic alloy according to claim 1 wherein the ratio of (Si and C) to (P and B) is more than 1.

10. A dust core consisting essentially of an alloy powder having fine crystal grains dispersed in an amorphous phase and as described in the following formula $$Fe_{100-a-b-c-d-e}Cu_aM'_bM''_cSi_dB_e$$

where:

"M'" is at least one element selected from the group consisting of Ti, Zr, Hf, V, Nb, Ta, Cr, Mo, W of the periodic table;

"M''" is at least one element selected from the group consisting of Mn, Co, Ni, Al, and the Platinum group;

and wherein "a", "b", "c", "d" and "e", expressed in atomic %, are as follows:

$3<a\leqq 8$ $0.1<b\leqq 8$ $0\leqq c\leqq 15$ $8\leqq d\leqq 22$ $3\leqq e\leqq 15$ $15\leqq d+e\leqq 28$.

11. A dust core according to claim 10 wherein the area ratio of the fine crystal grains present in the alloy is at least 30%.

12. A dust core according to claim 10 wherein at least 80% of the fine crystal grains are 50 Å to 300 Å.

13. A dust core according to claim 11 wherein at least 80% of the fine crystal grains are 50 Å to 300 Å.

14. A dust core according to claim 10 wherein the amount Cu is more than 3 and less than 5 atomic %.

15. A dust core according to claim 10 wherein the amount of M' is 1 to 7 atomic %.

16. A dust core according to claim 10 wherein the amount of M' is 1.5 to 5 atomic %.

17. A dust core according to claim 10 wherein amount of M'' is less than 10 atomic %.

18. A dust core according to claim 10 wherein the amount of Cu, M' and M'' is 3.1 to 25 atomic %.

19. A dust core according to claim 10 wherein the amount of Si is 10 to 22 atomic %.

20. A dust core according to claim 10 wherein the amount of Si is 12 to 18 atomic %.

21. A dust core according to claim 10 wherein the amount of B is 5 to 10 atomic %.

22. A dust core according to claim 10 wherein the particle size of the alloy powder is in the range of 1 to 100 μm.

23. An Fe-based soft magnetic alloy according to claim 1, wherein "a" is greater than or equal to 3.5.

24. An fe-based soft magnetic alloy according to claim 1, wherein "a" is greater than or equal to 4.0.

25. A dust core according to claim 10, wherein "a" is greater than or equal to 3.5.

26. A dust core according to claim 10, wherein "a" is greater than or equal to 4.0.

27. An Fe-based soft magnetic alloy according to claim 1, wherein the alloy has a core loss of between 290 and 330 mW/cc or between 210 and 250 mW/cc.

28. A dust core according to claim 10 wherein the alloy has a core loss of between 290 and 330 mW/cc or between 210 and 250 mW/cc

29. An Fe-based soft magnetic alloy according to claim 1, wherein the alloy does not contain Nb.

30. A dust core according to claim 1, wherein the alloy does not contain Nb.

* * * * *